United States Patent
Vera Villarroel et al.

(10) Patent No.: US 10,955,691 B2
(45) Date of Patent: Mar. 23, 2021

(54) DUAL LOOP BIAS CIRCUIT WITH OFFSET COMPENSATION

(71) Applicant: Elenion Technologies, LLC, New York, NY (US)

(72) Inventors: Ariel Leonardo Vera Villarroel, Union City, NJ (US); Abdelrahman Ahmed, Brooklyn, NY (US); Daihyun Lim, Edgewater, NJ (US); Alexander Rylyakov, Staten Island, NY (US)

(73) Assignee: Elenion Technologies, LLC, New York, NY (US)

(*) Notice: Subject to any disclaimer, the term of this patent is extended or adjusted under 35 U.S.C. 154(b) by 0 days.

(21) Appl. No.: 16/439,825

(22) Filed: Jun. 13, 2019

(65) Prior Publication Data
US 2020/0393706 A1    Dec. 17, 2020

(51) Int. Cl.
*G02F 1/01* (2006.01)
*G02F 1/225* (2006.01)
(Continued)

(52) U.S. Cl.
CPC .......... *G02F 1/0123* (2013.01); *G02F 1/2255* (2013.01); *H03F 3/45076* (2013.01); *H03G 3/3042* (2013.01); *G02F 2001/212* (2013.01)

(58) Field of Classification Search
CPC ............. G02F 1/0121; G02F 2001/212; G02F 1/2257; G02F 1/17; G02F 1/21;
(Continued)

(56) References Cited

U.S. PATENT DOCUMENTS 7,848,369 B1 * 12/2010 Bostak ................. G02F 1/0121
372/26
8,841,968 B2 * 9/2014 Hadji-Abdolhamid ......................
H03F 3/45475
330/260
(Continued)

OTHER PUBLICATIONS

Dongi et al; A wideband CMOS VGA with dB-Linear Gain Based on Active feedback and negative capacitance; 25th Iranian Conference on Electrical Engineering; 2017; pp. 506-510 (Year: 2017).*
(Continued)

*Primary Examiner* — Amritbir K Sandhu
(74) *Attorney, Agent, or Firm* — Stratford Managers Corporation

(57) ABSTRACT

Within a modulator driver, different blocks are employed, e.g. a buffer, one or more variable gain amplifiers (VGA), and a final driver stage. Each of these blocks has an optimum bias point for best performance; however, interconnecting the blocks requires sharing the DC bias points in their interface, which does not necessarily match the optimum performance bias point of each block. Accordingly, a first offset feedback loop extending from reference points after a selected one of the blocks to an input of one of the blocks. The first offset feedback loop includes current sources capable of delivering a variable current to the input of the selected block in order to compensate any offset in an amplified differential input electrical signal measured at the reference points. A first bias feedback loop is also provided, including a current sinker for subtracting excess current introduced in the first offset compensation feedback loop.

20 Claims, 7 Drawing Sheets

(51) Int. Cl.
*H03G 3/30* (2006.01)
*H03F 3/45* (2006.01)
*G02F 1/21* (2006.01)

(58) Field of Classification Search
CPC ... G02F 1/0123; G02F 1/2255; H04B 10/516; H04B 10/5059; H04B 10/541; H04B 10/588; H04B 2210/254; H04L 25/03076; H04L 25/03114; H01S 5/0427; H03F 3/45076; H03G 3/3042
USPC .................................................. 398/140–172
See application file for complete search history.

(56) References Cited

U.S. PATENT DOCUMENTS

| | | | | |
|---|---|---|---|---|
| 9,634,611 | B1* | 4/2017 | Vera Villarroel | H03G 3/3036 |
| 10,171,057 | B1* | 1/2019 | Ahmed | H03G 3/3084 |
| 10,498,461 | B1* | 12/2019 | Vera Villarroel | H03F 3/087 |
| 10,644,652 | B2* | 5/2020 | Vera Villarroel | H03F 3/45475 |
| 10,656,441 | B2* | 5/2020 | Ding | G02F 1/0121 |
| 2005/0147136 | A1* | 7/2005 | Pobanz | G02F 1/0121 372/26 |
| 2008/0088354 | A1* | 4/2008 | Mosinskis | G02F 1/2255 327/361 |
| 2009/0245813 | A1* | 10/2009 | Bonthron | G02F 1/225 398/188 |
| 2012/0001697 | A1* | 1/2012 | Doany | H03F 3/082 330/310 |
| 2012/0141062 | A1* | 6/2012 | Smith | G01C 19/726 385/3 |
| 2013/0308893 | A1* | 11/2013 | Zuffada | H03F 3/3001 385/3 |
| 2015/0263812 | A1* | 9/2015 | Tatsumi | H04B 10/588 398/189 |
| 2016/0087727 | A1* | 3/2016 | Nagatani | H03G 1/0023 398/186 |
| 2016/0285427 | A1* | 9/2016 | Itabashi | H03F 3/45618 |
| 2016/0380699 | A1* | 12/2016 | Tatsumi | H03F 3/55 330/286 |
| 2017/0117863 | A1* | 4/2017 | Tanaka | H03F 3/211 |
| 2017/0170894 | A1* | 6/2017 | Gu | H04L 27/01 |
| 2017/0351122 | A1* | 12/2017 | Dupuis | H04B 10/5059 |
| 2017/0353333 | A1* | 12/2017 | Dupuis | H04L 25/03114 |
| 2018/0198431 | A1* | 7/2018 | Itabashi | H03G 3/20 |
| 2018/0341164 | A1* | 11/2018 | Williams | G02F 1/2257 |
| 2018/0356654 | A1* | 12/2018 | Tatsumi | G02F 1/2257 |
| 2019/0296756 | A1* | 9/2019 | Ali | H03M 1/002 |
| 2020/0083855 | A1* | 3/2020 | Vera Villarroel | H03F 3/08 |
| 2020/0091881 | A1* | 3/2020 | Lim | H03F 3/10 |
| 2020/0110290 | A1* | 4/2020 | Nagaraju | G02F 1/0123 |
| 2020/0136560 | A1* | 4/2020 | Vera Villarroel | H03F 1/0222 |

OTHER PUBLICATIONS

Liu et al; A 5-Gb/s 66dB CMOS variable gain amplifier with reconfigurable DC-Offset Cancellation for Multi-standard Applications ; IEEE; 2018; pp. 1-7. (Year: 2018).*

* cited by examiner

DUAL LOOP BIAS CIRCUIT WITH OFFSET COMPENSATION

TECHNICAL FIELD

The present invention relates to a driver circuit for an optical modulator, and in particular to a driver circuit with a dual loop bias circuit with offset compensation.

BACKGROUND

The modulation of the optical signal is done using a transducer that converts an electrical signal into the optical domain via a, e.g. a Mach-Zehnder, modulator. The transducer modifies an optical input signal according to an electrical input signal, whereby the optical output signal contains information from the electrical signal to be transmitted over an optical waveguide. For optical transmission the electrical signal is mapped using a modulation scheme, e.g. 64 QAM. The resulting electrical signal is amplified using a voltage-to-voltage amplifier, i.e. a driver, since its output drives the electro-optical modulator e.g. Mach-Zehnder, modulator. The optical modulator requires a voltage with low distortion and several volts of magnitude.

The driver input signal typically has been processed to maximize the channel capacity. The processing includes the manipulation of magnitude and phase of the electrical signal. In order to reduce power consumption, all processing is done with low power circuits, which limits the maximum voltage magnitude the driver input signal can provide. Accordingly, the function of the driver is to amplify the input signal to values required by the modulator while adding minimum distortion.

The driver input requires a specific voltage/current bias. However, the driver input electrical signal is typically provided by a digital-to-analog converter (DAC), and the specific bias conditions of the driver do not necessarily match the bias conditions of the block preceding the driver, e.g. the DAC, in a DSP. DC coupling between the DAC and the driver chip is not desired as both use different supply/voltage domains. For optimum operation, the biasing of the DAC's output and the driver's input, may be different. Therefore, the interface between the DAC and the drive may be AC-coupled, i.e. DC-blocked, allowing independent biasing of the circuit blocks. Unfortunately, AC-coupling introduces LFC/area challenges that have to be dealt with. Moreover, broadband operation requires the use of large value DC-blocking capacitors that typically cannot be integrated on-chip.

Furthermore, several blocks are used in the driver, for example: a buffer, a VGA, and a final driver stage. Ideally, each of these blocks may be optimized for best performance, and part of the optimization is the input bias conditions. However, when the blocks are cascaded, the output bias of the preceding block sets the bias condition at the input of the next block. Accordingly, is not always possible to have the optimum bias at the interface of different blocks. As above, because the blocks are integrated in the same chip, the use of on-chip large value capacitors is impractical.

The implementation of AC-coupling may be done using capacitive coupling; however, the value of the capacitance needs to be large in order to obtain a low cut-off frequency, for example 1 MHz. Unfortunately, a high value capacitance will have parasitics that limit the frequency response.

An object of the present invention is to overcome the shortcomings of the prior art by providing a circuit that provides independent biasing at the input of a circuit block. The solution should be implementable on-chip, allow broadband operation, and allow for correction of any mismatch that originates an offset in the biasing point of a differential input.

SUMMARY OF THE INVENTION

Accordingly, the present invention relates to a driver for an optical modulator comprising:
a differential input for receiving a differential input electrical signal;
a buffer for separating the driver from a previous circuit;
at least one variable gain amplifier (VGA) for amplifying the differential input electrical signal into an amplified differential electrical signal;
a final driver stage amplifier for outputting the amplified electrical signal to the optical modulator;
a first AC coupling enabling independent biasing of the buffer;
a first offset feedback loop extending from reference points after a selected one of the gain amplifiers or the final driver stage amplifier to an input of the buffer, the first offset feedback loop including current sources capable of delivering a variable current at the differential input of the buffer in order to compensate any offset in the amplified differential input electrical signal measured at the reference points; and
a first bias feedback loop including a current sinker for subtracting excess current introduced in the first offset feedback loop.

Another aspect of the present invention relates to a driver for an optical modulator comprising:
a differential input for receiving a differential input electrical signal;
a buffer for separating the driver from a previous circuit;
at least one variable gain amplifier for amplifying the differential input electrical signal into an amplified differential electrical signal;
a first final driver stage amplifier for outputting the amplified electrical signal to the optical modulator;
an AC coupling enabling independent biasing of one of the gain amplifiers or the final driver stage amplifier;
a first offset feedback loop extending from reference points at an output of a selected one of the gain amplifiers or the first final driver stage amplifier to an input of the selected one or a previous one of the gain amplifiers or the first final driver stage amplifier, including current sources capable of delivering a variable current at the input of the buffer in order to compensate any offset in the amplified differential input electrical signal measured at the reference points; and
a first bias feedback loop including a current sinker for subtracting excess current introduced in the first offset feedback loop.

BRIEF DESCRIPTION OF THE DRAWINGS

The invention will be described in greater detail with reference to the accompanying drawings which represent preferred embodiments thereof, wherein.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

The proposed solution description is based in a SiGe BiCMOS technology, however, the principle presented may be applied to Bipolar, CMOS or other technologies.

Figure 1:
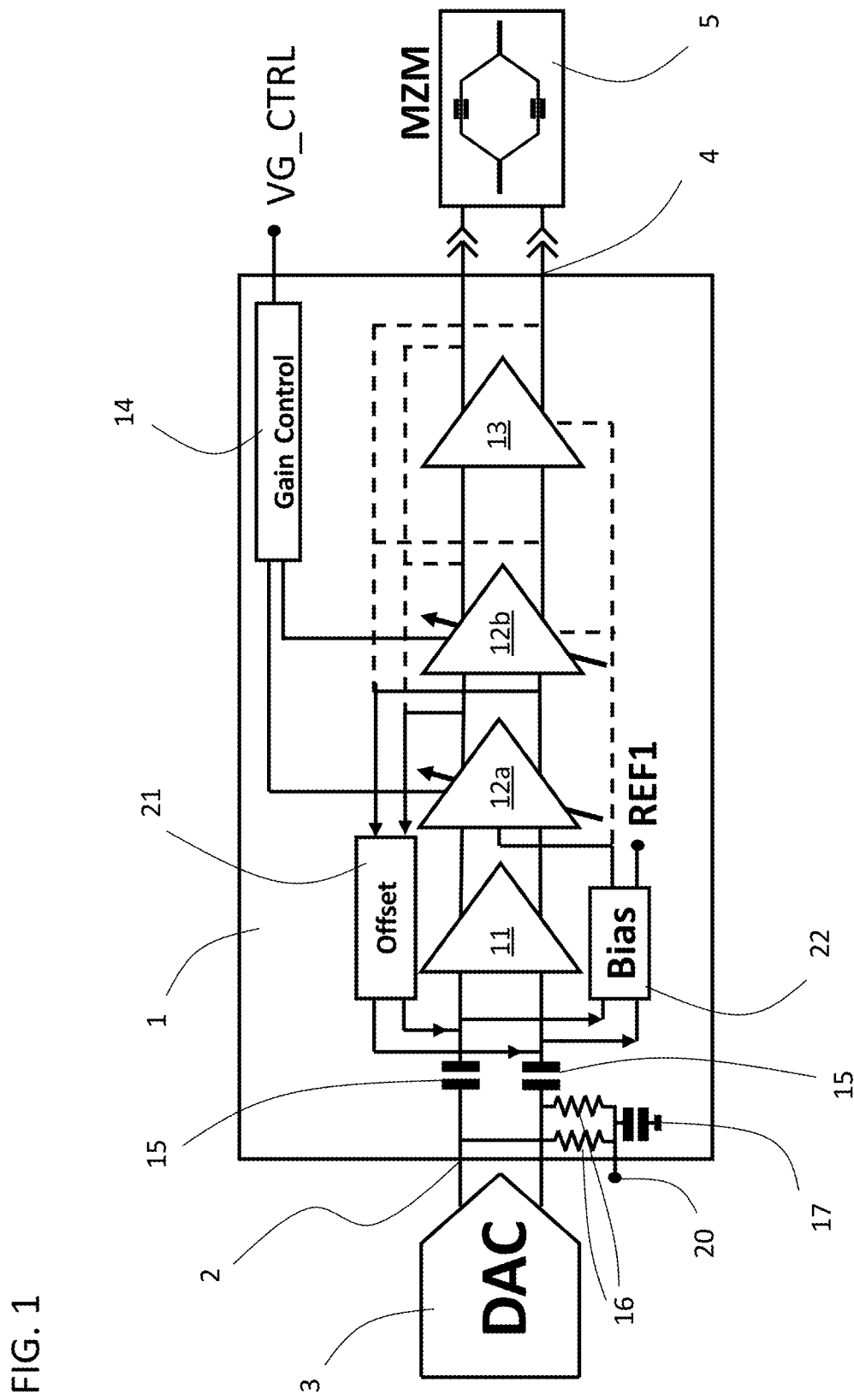
FIG. 1 is an schematic diagram of an optical modulator device in accordance with an embodiment of the present invention.

With reference to FIG. 1, a modulator device, in accordance with an embodiment of the present invention, includes a modulator driver 1, which receives a differential input electrical signal at a differential input 2, which is typically provided by a digital-to-analog converter (DAC) 3, and outputs an amplified differential output electrical signal at an output 4 to a modulator 5, e.g. a Mach-Zehnder modulator. The modulator 5 receives an optical signal for modulation from a light source.

Information is processed locally in the electrical domain. For optical transmission the input electrical signal may be mapped using a modulation scheme, e.g. 64 QAM. The input electrical signal of the driver 1 typically has been processed to maximize the channel capacity. The processing includes the manipulation of magnitude and phase of the input electrical signal. In order to reduce power consumption, all processing is done with low power circuits, which limits the maximum voltage magnitude the driver input signal can provide. Accordingly, the function of the driver 1 is to amplify the input electrical signal to values required by the modulator 5 while adding minimum distortion.

The driver 1 comprises several blocks, e.g. a buffer 11 to separate or isolate the driver 1 from previous circuits with a different impedance level; one or more variable gain amplifiers (VGA) 12a-12n for amplifying the input voltage, two of which are illustrated as VGA's 12a and 12b, and a final driver, e.g. amplifier, stage 13 for outputting the amplified voltage signal to the modulator 5. The VGA's 12a-12n may be controlled by a gain control circuit 14 based on one or more gain control signals VG CTRL. Each of these blocks 11 to 13 has an optimum bias point for best performance; however, interconnecting the blocks 11 to 13 requires sharing the DC bias points in their interface, which does not necessarily match the optimum performance bias point of each block.

The input 2 of the driver 1 requires a specific voltage/current bias. The specific bias conditions of the driver 1 do not necessarily match the bias conditions of the block preceding the driver, e.g. the DAC 3 in a DSP. To overcome different bias conditions the circuits may be AC coupled using capacitors 15, enabling independent biasing of the circuit blocks 11-13. However, broadband operation requires the use of large value DC-blocking capacitors that typically cannot be integrated on-chip. Moreover, since several blocks, e.g. buffer 11, VGAs 12a and 12b, and final driver stage 13, are used in the driver 1, each of the blocks should be optimized for best performance. However, part of the optimization is the input bias conditions, but when the blocks 11 to 13 are cascaded, the output bias of the preceding block sets the bias condition at the input of the next block. Therefore, is not always possible to have the optimum bias at the interface of different blocks 11 to 13. Furthermore, because the blocks 11 to 13 are integrated in the same chip, the use of on-chip large value capacitors between blocks 11 to 13 is also impractical.

The present disclosure provides a high-pass circuit technique to implement an on-chip AC-coupling using a dual feedback loop implementation for biasing and offset cancellation. The low cut-off frequency, e.g. less than 600 kHz, preferably less than 400 kHz, even more preferably less than 200 kHz, and even more preferably between 100 kHz and 1000 kHz, enables the technique to be implemented at an interface between chips, e.g. the DAC-to-Driver interface, and/or an interface between blocks 11 to 13 within the driver 1, e.g. a VGA-to-Final Driver-Stage.

The DC-blocking capacitors 15, disposed between input 2 and buffer 11, are used to AC-couple the input electrical signal from the DAC 3 to the driver 1. On-chip termination may be done using termination resistors 16, in parallel with the DC-blocking capacitors 15, therefore the low cut-off frequency is defined by the capacitance, e.g. 2 pF to 10 pF, preferably 4 pF to 6 pF, of the capacitors 15, and the input impedance, e.g. greater than 10 kΩ, preferably between 20 kΩ to 100 kΩ, and more preferably between 40 kΩ to 60 kΩ, at the buffer input based on the equation: Reactance $X=1/2\pi Cf$. As an example, for an LFC of 600 kHz, the input impedance may be 51 kΩ requiring a capacitance of 5.2 pF for the capacitors 15.

A common-mode decoupling capacitor 17 may be disposed between the termination resistors 16 to improve common-mode input return loss. In a conventional implementation, in which the input impedance is approximately 50 Ohm, the capacitors 15 would have to be in the range of 5 nF to get the same LFC (600 kHz) which is beyond what can be integrated on-chip.

To make the impedance high, e.g. greater than 10 kΩ, preferably between 20 kΩ to 100 kΩ, and more preferably between 40 kΩ to 60 kΩ, and provide a biasing voltage/current at the input of the buffer 11, a first offset feedback loop 21, including current sources may be used. The first offset feedback loop 21 may extend from after any one of the blocks 12a, 12b or 13 to before the buffer 11, e.g. after the DC blocking capacitors 15.

In certain implementations, a 'DAC_BIAS' pin 20 may be used to provide biasing from a voltage (or current) source to optimize power/performance for the DAC 3. In an open collector DAC implementation the DAC_BIAS voltage (or current) may be very important for providing the DAC output stage with the needed voltage bias.

Figure 2A:
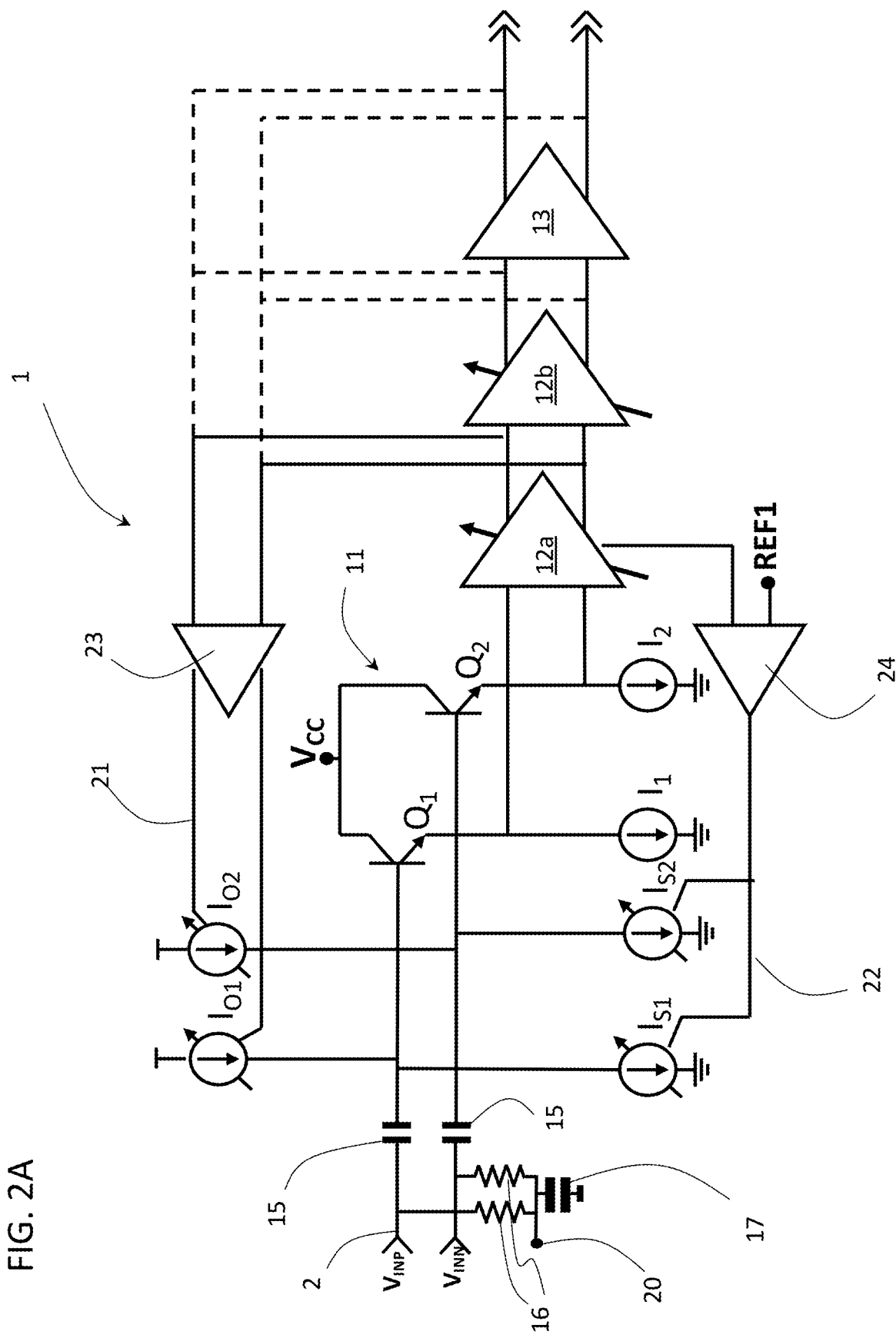
FIG. 2A is a schematic diagram of a driver of the device of FIG. 1.

FIG. 2A illustrates an embodiment of a dual-loop bias/offset at the input of the driver 1. In this embodiment the buffer 11 is comprised of emitter followers, including a differential pair of transistors $Q_1$ and $Q_2$ with their bases connected to the input ($V_{INP}$ and $V_{INN}$) 2, their emitters connected to the input of the first VGA 12a, and their collectors connected to a voltage source $V_{CC}$, based on the technology, e.g. 3.3V for SiGe processes; however, other topologies can be used with the understanding that the low cut-off frequency will be defined by the DC-blocking capacitors 15 and the input impedance of the driver circuit 1 being biased with this approach. In the illustrated embodiment, current sources $I_{O1}$ and $I_{O2}$ deliver a current that varies in order to compensate any offset measured in comparator 23 at the output of the first VGA 12a. However, the offset correction may be done with references measured at different points, e.g. the output of the second VGA 12b or the output of the final driver stage amplifier 13. The comparator 23 compares the DC voltages at the output of the first VGA 12a (or the second VGA 12b or the final driver stage amplifier 13 depending on which one is physically connected). Ideally the DC voltages at the outputs of the first VGA 12a are exactly the same. Any difference in voltage is sensed by the comparator 23 and reflected in the output thereof, which is used to control the current sources $I_{O1}$ and $I_{O2}$ to adjust the two voltages $V_{INP}$ and $V_{INN}$ so that the voltages at the output of the first VGA 12a are balanced.

Figure 2B:
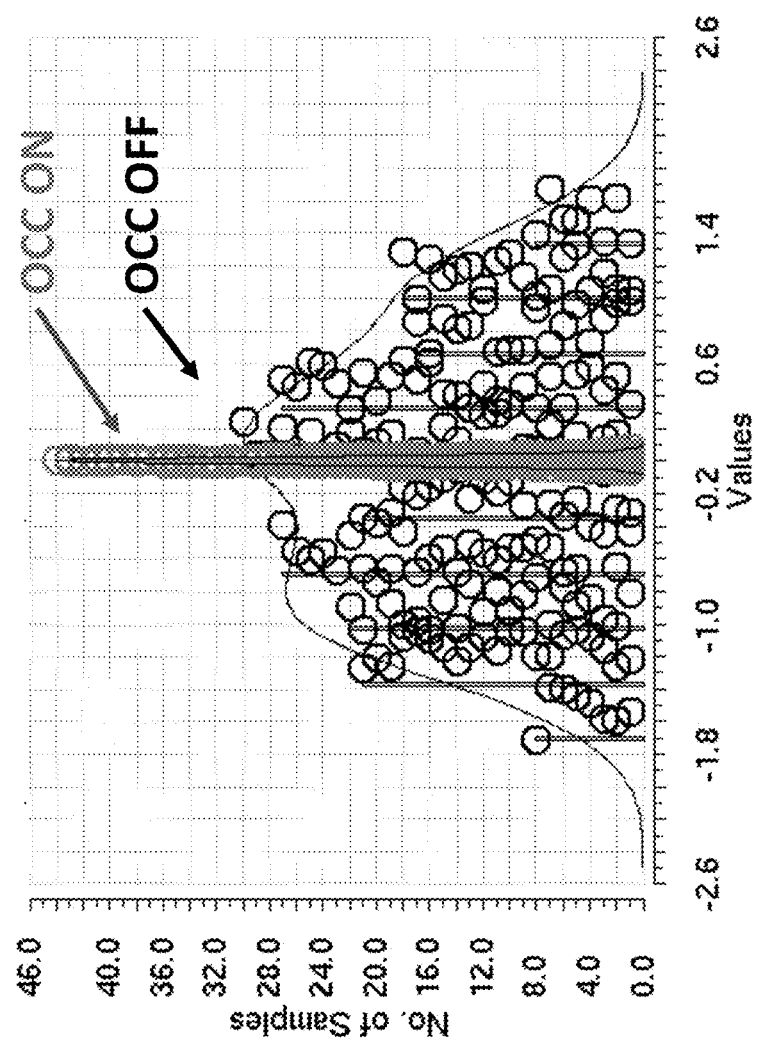
FIG. 2B is a plot of voltage offset in a Monte Carlo simulation of voltage output offset (in normalized units) with and without the offset cancellation circuit in the driver of FIG. 2A.

FIG. 2B is a plot of voltage offset in a Monte Carlo simulation of output offset with and without the offset cancellation circuit (OCC), illustrating a range of offset from approximately −2.0 to +2.0 (in normalized units) with the OCC off, and a range of about −0.1 to +0.1 with the OCC on. The narrow grey-shaded distribution indicates when offset cancellation is enabled.

The currents from $I_{O1}$ and $I_{O2}$ bias the transistors $Q_1$ and $Q_2$, however, any excess current should be subjected to a current sink. The bias current has a fixed and a variable component. The total bias current must always satisfy the maximum current required by the input stage, e.g. buffer 11, while maintaining a high impedance value. The variable component is used to compensate any offset originated due to mismatch and process variation by sensing the differential reference, e.g. at the output of the first VGA 12a, and varying the variable portions of the currents $I_{O1}$ and $I_{O2}$.

A first bias feedback loop 22 implements a current sinker. The current sinker subtracts any excess current introduced in the first offset compensation feedback loop 21, while using a reference voltage REF1, which may be provided on-chip or from a separate source, e.g. other chip, to set the optimum common-mode bias condition. Variable current sources $I_{S1}$ and $I_{S2}$ act as current sinks for excess current from the offset compensation feedback loop 21. In the illustrated embodiment, the variable current sources $I_{S1}$ and $I_{S2}$ are within the second feedback loop 22 that senses a sample voltage (or current) in the first VGA 12a, and compares that sample voltage (or current) to the reference REF1 in a comparator 24, which is provided on-chip or from a separate source, e.g. other chip, for generating a comparison signal. The sample voltage (or current) could be the voltage of any node (or current in any branch) inside the first VGA 12a that is affected by changes in the input common mode. The designer may choose the location of the sample voltage (or current) based on the topology used in the first VGA 12a, and what node best reflects the changes in the input common mode. For example: the sample voltage may be the common mode voltage at the emitters of the input differential pair of the first VGA 12a, which may be sensed using a high resistance, e.g. 20 KOhm. The magnitude of the current in current sources $I_{S1}$ and $I_{S2}$ is varied by the comparison signal from the comparator 24 to provide the desired (optimum) bias for the bias transistors $Q_1$, and $Q_2$. The references for the first bias feedback loop 22, may also be taken from different points of the driver chain, e.g. in the second VGA 12b or in the final driver stage amplifier 13.

Figure 3:
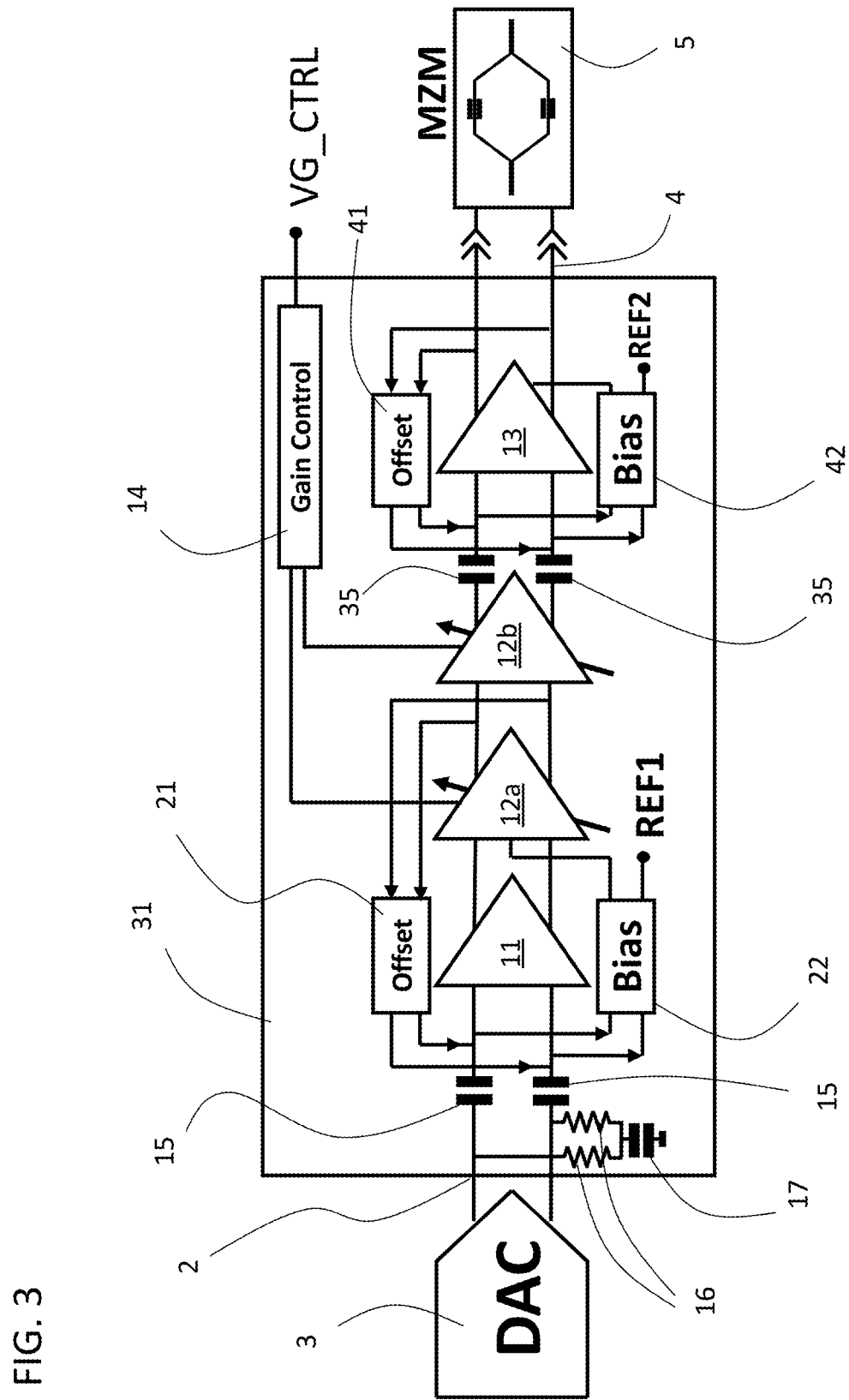
FIG. 3 is an schematic diagram of an optical modulator device in accordance with an embodiment of the present invention.

With reference to FIG. 3, a dual loop bias/offset may be applied at a plurality of different locations within a driver 31. In the example of FIG. 3, a second offset compensation feedback loop 41, similar to first offset compensation feedback loop 21, is disposed between the second VGA 12b and the final driver stage amplifier 13, and a second bias feedback loop 42, similar to the first bias feedback loop 22, extends between additional reference points after the last stage amplifier 13 and the output of the second VGA 12b. A second pair of DC-blocking capacitors 35, similar to capacitors 15, disposed between the output of the second VGA 12b and the input of the final driver stage amplifier 13, are used to AC-couple the input electrical signal from the VGA 12b to the final driver stage amplifier 13. The low cut-off frequency is defined by the blocking capacitors 35 and the impedance at the input of the final driver stage amplifier 13. Different circuit topologies and different technologies will have an optimum solution, therefore, the present invention is not restricted to a particular technology and circuit topology.

Figure 4:
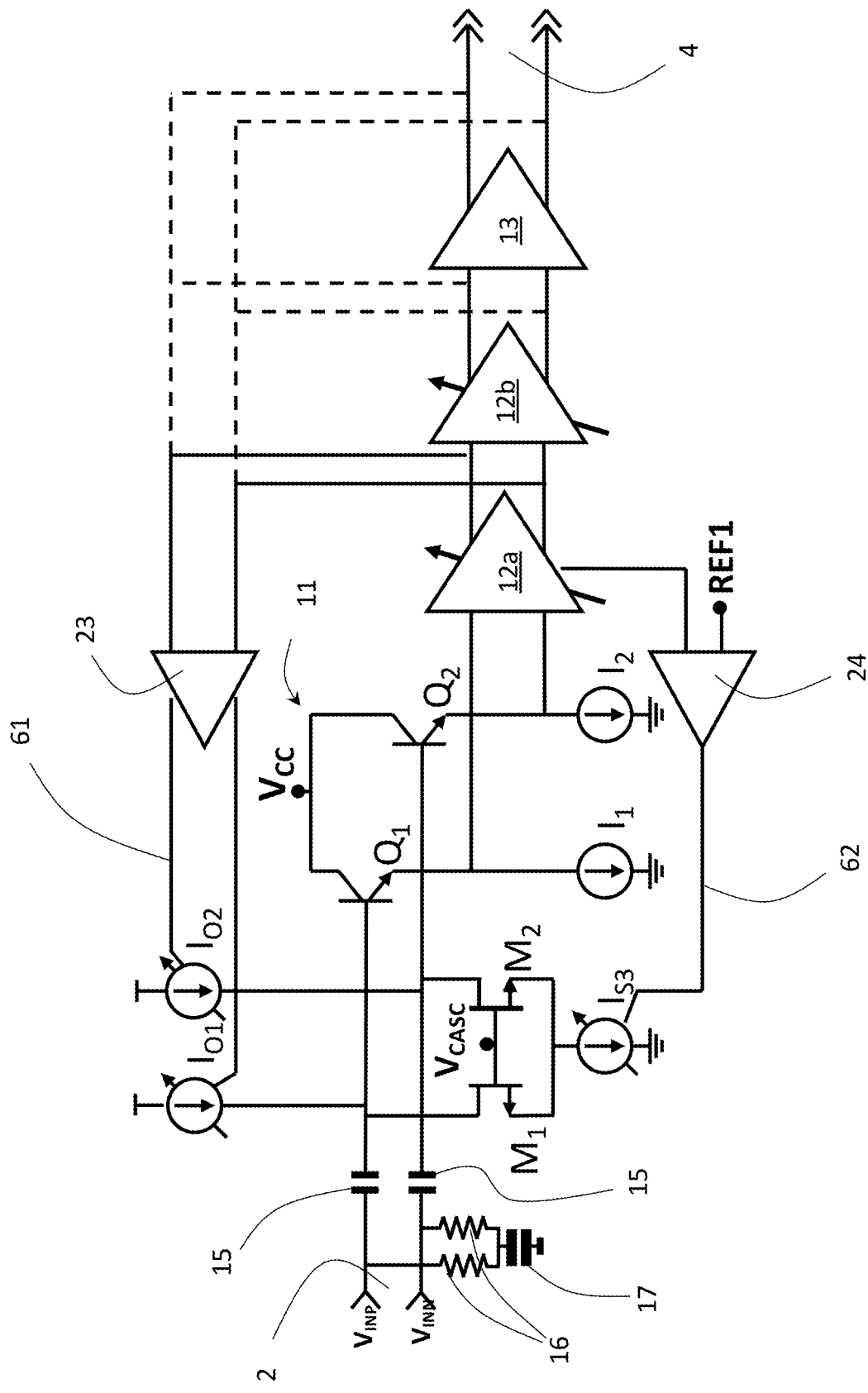
FIG. 4 is a schematic diagram of a dual-feedback loop bias/offset for a buffer in the driver of the device of FIG. 1 or 3.

FIG. 4 illustrates a practical implementation of a dual-loop bias/offset at the input 2, in which transistors, e.g. MOSFETS, $M_1$ and $M_2$ are used to implement high impedance at the input nodes of the transistors $Q_1$ and $Q_2$, and consequently define a low cut-off frequency together with the capacitance of the DC-blocking capacitors 15. The gates of the transistors $M_1$ and $M_2$ are connected to each other and to a voltage source $V_{CASC}$. Each of the drains of the transistors $M_1$ and $M_2$ are connected to a respective one of the inputs ($V_{INP}$ or $V_{INN}$) 2, and the sources of the transistors $M_1$ and $M_2$ are connected to a single current source $I_{S3}$. $V_{CASC}$ may be a DC voltage used to bias the cascode devices $M_1/M_2$ and make sure that the current source $I_{S3}$ is operating as desired. When biased correctly, the chosen current from the current source $I_{S3}$ (based on the operation of offset compensation feedback loop 61) is divided between the transistors $M_1$ and $M_2$ to sink any excess current from the bias feedback loop 62. By cascading the current source $I_{S3}$ using transistors $M_1/M_2$ the input impedance is increased by a factor equal to the intrinsic gain of $M_1/M_2$.

As above, the bias feedback loop 62 senses a voltage (or current) in the first VGA 12a, and compares that voltage (or current) to the reference voltage (or current) REF1 in the comparator 24, which is provided on-chip or from a separate source, e.g. other chip. The magnitude of the current in current source $I_{S3}$ is varied to provide the desired (optimum) bias for the bias transistors $Q_1$, and $Q_2$.

Figure 5:
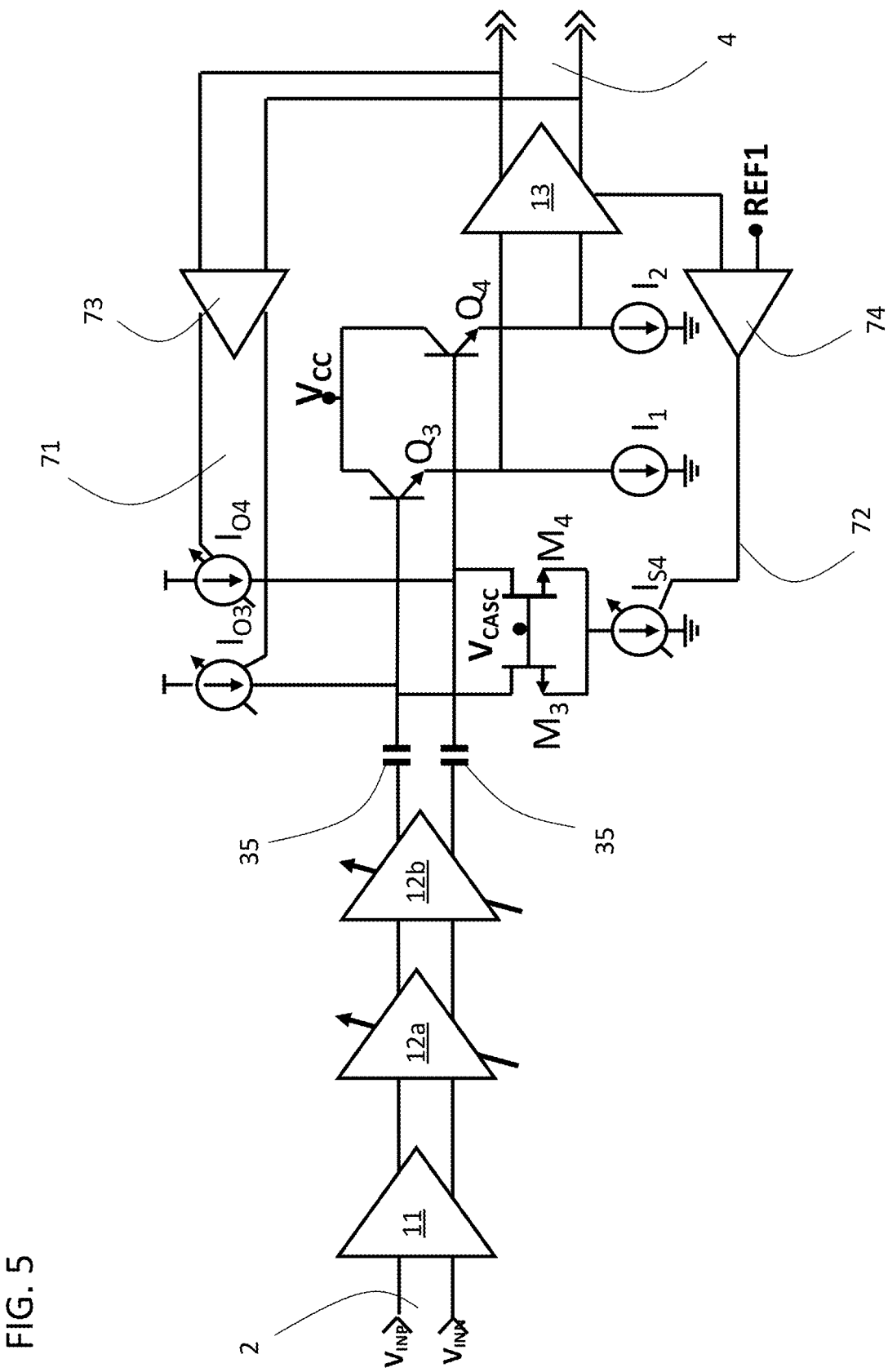
FIG. 5 is a schematic diagram of a dual-feedback loop bias/offset for a final driver stage in the driver of the device of FIG. 3.

FIG. 5 illustrates an embodiment of the present disclosure, in which the dual loop solution is implemented before and after the final driver stage amplifier 13, e.g. between the output of the second VGA 12b and the output of the final driver stage amplifier 13. This dual loop embodiment may be used as the second offset and second bias feedback loops 41 and 42 from FIG. 3 or a stand-alone dual loop embodiment comprised of an offset feedback loop 71 and a bias feedback loop 72, for in between blocks 11 to 13 without an initial dual loop arrangement for the input to the buffer 11. In this embodiment, the final driver stage amplifier 13 may include a pair of emitter followers, including a differential pair of transistors $Q_3$ and $Q_4$ with their bases connected to the output of the second VGA 12b, their emitters connected to current sources $I_1$ and $I_2$ and the input of the first modulator 5, and their collectors connected to a voltage source $V_{CC}$, as above; however, other topologies can be used. In the illustrated embodiment, the offset feedback loop 71 includes current sources $I_{O3}$ and $I_{O4}$, which deliver a current that varies in order to compensate any offset between voltages measured in comparator 73 at the output of the final driver stage amplifier 13, as hereinbefore described. However, the offset correction may be done with references measured at different points, e.g. the output of the first VGA 12a.

The currents from the current sources $I_{O3}$ and $I_{O4}$ bias transistors $Q_3$ and $Q_4$, respectively; however, any excess current should be subjected to a current sink. The bias current has a fixed and a variable component. The total bias current must always satisfy the maximum current required by the final driver stage 13, while maintaining a high impedance value. The variable component is used to compensate any offset originated due to mismatch and process variation by sensing the differential reference, e.g. at the output of the final driver stage amplifier 13, and varying the variable portions of the currents $I_{O3}$ and $I_{O4}$. The low-cut off frequency is also defined by the DC-blocking capacitors 35 and the impedance at the inputs of the transistors $Q_3$, $Q_4$.

The bias feedback loop 72 may comprise transistors, e.g. MOSFETS, $M_3$ and $M_4$, which are used to implement high impedance at the input nodes of the transistors $Q_3$ and $Q_4$, and consequently define a low cut-off frequency together with the capacitance of the DC-blocking capacitors 35. The gates of the transistors $M_3$ and $M_4$ are connected to each other and to a voltage source $V_{CASC}$. Each of the drains of the transistors $M_3$ and $M_4$ are connected to a respective one of the inputs ($V_{INP}$ or $V_{INN}$) 2, via the outputs of the second VGA 12b, and the sources of the transistors $M_3$ and $M_4$ are connected to a single current source $I_{S4}$, as hereinbefore described. As above, the bias feedback loop 72 senses a voltage (or current) in the final driver stage amplifier 13, and compares that voltage (or current) to the reference voltage (or current) REF1 in the comparator 74, which is provided on-chip or from a separate source, e.g. other chip. The magnitude of the current in current sources $I_{S4}$ is varied to provide the desired (optimum) bias for the bias transistors $Q_3$, and $Q_4$. The currents from $O_{O3}$, $I_{O4}$ and $I_{S4}$ should be scaled to satisfy the bias requirements of $Q_3$ and $Q_4$. Alternatively, the bias feedback loop may comprise the elements of bias feedback loop 22 (FIG. 2).

Figure 6:
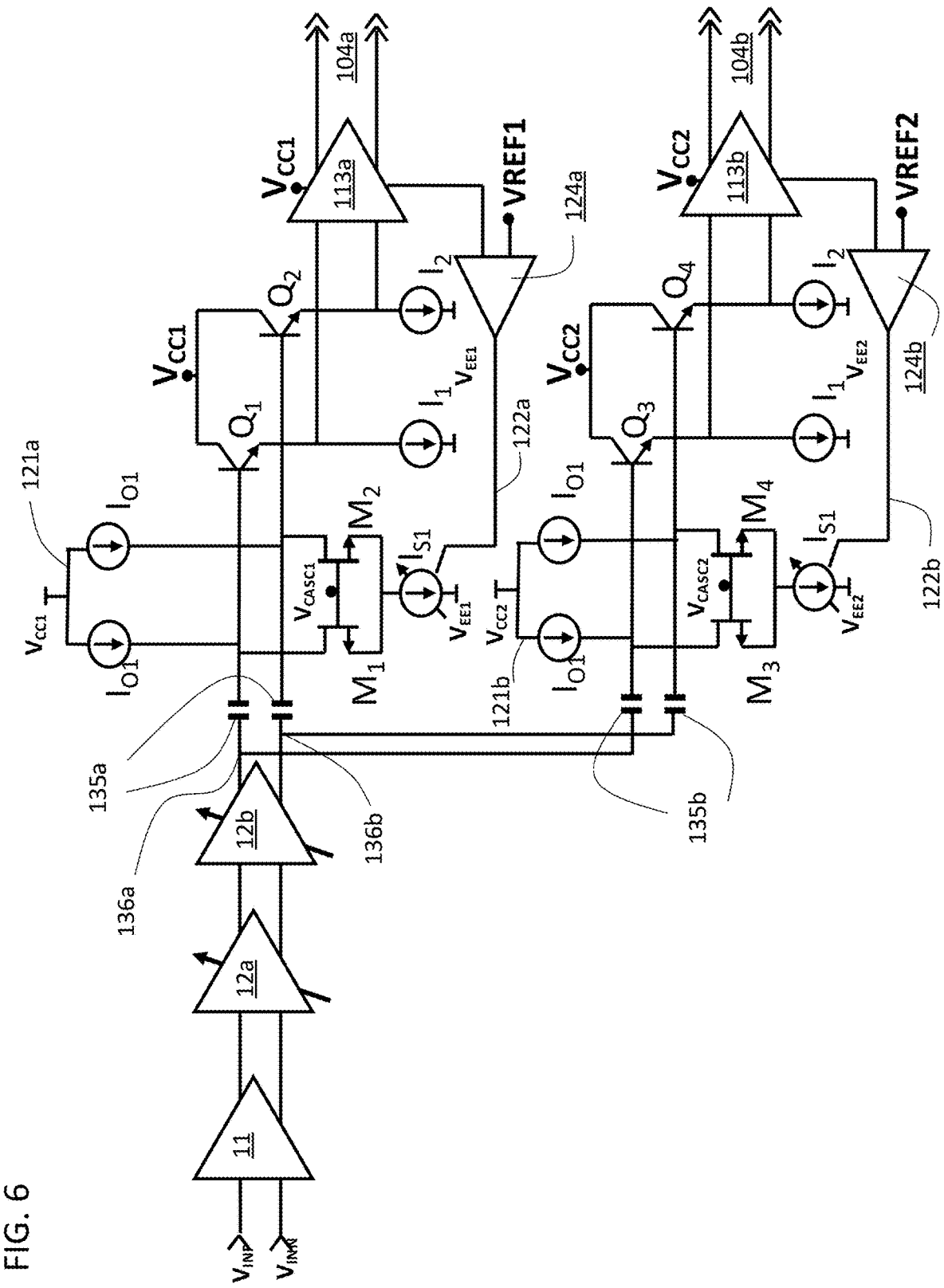
FIG. 6 is a schematic diagram of a dual-feedback loop bias/offset for parallel final driver stages in a driver in accordance with another embodiment of the present invention.

With reference to FIG. 6, an inter-stage AC coupling is implemented between the second VGA 12b and two, parallel final driver stages 113a and 113b at different supply voltage domains $V_{CC1}/V_{EE1}$ and $V_{CC2}/V_{EE2}$. A dual feedback loop bias/offset may be provided for the buffer 11, as in FIG. 2A or 4, and a offset feedback loop 41 may be provided for the final driver stages 113a and 113b. Splitters 136a and 136b are provided for splitting the amplified input electrical signal into parallel sub signals for transmission to a respective on the final driver stages 113a and 113b. The low-cut off frequencies are also defined by the DC-blocking capacitors 135a and 135b, similar to capacitors 35a and 35b, and the impedances at the inputs of the corresponding bias transistors $Q_1$, $Q_2$, $Q_3$, and $Q_4$, as above. Current sources $I_{O1}$, each of which may provide the same amount of current, and current sources $I_{S1}$ (small) in bias feedback loops 122a and 122b may be scaled to satisfy the impedance at the inputs of the bias transistors $Q_1$, $Q_2$, $Q_3$, and $Q_4$, i.e. the bias requirements of bias transistors $Q_1$, $Q_2$, $Q_3$, and $Q_4$ with lower power consumption. Conventionally, the level-shifting for two different power supply voltage sets ($V_{CC1}$, $V_{EE1}$, $V_{CC2}$, $V_{EE2}$) includes an emitter follower, which consumes a large amount of power; however, the AC-coupling scheme saves the level-shifting power consumption.

$V_{CASC1}$ and $V_{CASC2}$ may be DC voltages used to bias the cascode devices $M_1/M_2$ and $M_3/M_4$, respectively, making sure that the current sources $I_{S1}$ are operating as desired. When biased correctly, the chosen current from the current sources $I_{S1}$ are divided between the transistors $M_1$ and $M_2$ (and $M_3$ and $M_4$) to sink any excess current from the current sources $I_{O1}$. By cascading the current source $I_{S1}$ using transistors $M_1/M_2$ and $M_3/M_4$ the input impedance is increased by a factor equal to the intrinsic gain of $M_1/M_2$ or $M_3/M_4$. The reference voltages VREF1 and VREF2 are compared via comparators 124a and 124b to sample voltages (as above) in the final driver stages 113a and 113b to provide fine control of the input common-mode voltage for the final amplifier stages 113a and 113b to achieve the best linearity at the driver outputs 104a and 104b.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A driver for an optical modulator comprising:
a differential input for receiving a differential input electrical signal;
a buffer for separating the driver from a previous circuit;
at least one variable gain amplifier (VGA) for amplifying the differential input electrical signal into an amplified differential electrical signal;
a final driver stage amplifier for outputting the amplified electrical signal to the optical modulator;
a first AC coupling enabling independent biasing of the buffer;
a first offset feedback loop extending from reference points after a selected one of the at least one variable gain amplifier or the final driver stage amplifier to an input of the buffer, the first offset feedback loop including current sources capable of delivering a variable current at the input of the buffer in order to compensate any offset in the amplified differential input electrical signal measured at the reference points; and
a first bias feedback loop including a current sinker for subtracting excess current introduced in the first offset feedback loop.

2. The driver according to claim 1, wherein the first offset feedback loop includes a first comparator capable of comparing portions of the amplified differential electrical signal after the selected one of the at least one variable gain amplifier or the final driver stage amplifier;
wherein the buffer includes a differential pair of transistors connected to a first one of the at least one VGA; and
wherein the current sources deliver current to the differential pair of transistors.

3. The driver according to claim 2, wherein the first bias feedback loop includes a second comparator capable of comparing a voltage or a current from the selected one of the at least one variable gain amplifier or the final driver stage amplifier to a reference voltage or current generating a first comparison signal; and
wherein the current sinker comprises a pair of current sinkers controlled based on the first comparison signal.

4. The driver according to claim 1, wherein the first bias feedback loop includes a second comparator capable of comparing a voltage or a current from the selected one of the at least one variable gain amplifier or the final driver stage amplifier to a reference voltage or current generating a first comparison signal; and
wherein the current sinker comprises:

a single current sinker controlled based on the first comparison signal; and a pair of transistors coupled between the current sinker and the input of the buffer.

5. The driver according to claim 4, further comprising a DC voltage source for biasing the pair of transistors and enabling current from the current sinker to be divided between the pair of transistors to sink any excess current from the bias feedback loop, whereby an input impedance of the driver is increased by a factor equal to an intrinsic gain of the pair of transistors.

6. The driver according to claim 1, further comprising:
a second AC coupling enabling independent biasing of one of the at least one variable gain amplifier or the final driver stage amplifier;
a second offset feedback loop extending from second reference points at an output of one of the at least one variable gain amplifier or the final driver stage amplifier to an input of one of the at least one variable gain amplifier or the final driver stage amplifier, including current sources capable of delivering a variable current at the input of the buffer in order to compensate any offset in the amplified differential input electrical signal measured at the second reference points; and
a second bias feedback loop including a current sinker for subtracting excess current introduced in the second offset feedback loop.

7. The driver according to claim 1, wherein the first AC coupling comprises:
first and second termination resistors; and first and second DC-blocking capacitors in parallel with the first and second termination resistors.

8. The driver according to claim 7, wherein the first AC coupling includes a common-mode decoupling capacitor disposed between the first and second termination resistors to improve common-mode input return loss.

9. The driver according to claim 8, wherein the previous circuit comprises a digital to analog converter (DAC); and wherein the first AC coupling includes a DAC bias pin to provide biasing from a voltage or current source to optimize at least one of power and performance for the DAC.

10. The driver according to claim 7, wherein each of the first and second DC-blocking capacitors comprises a capacitance of between 2 pF to 10 pF; and wherein each of the first and second termination resistors comprises a resistance of between 20 kΩ to 100 kΩ, whereby a cut off frequency of the first AC coupling is between 100 kHz and 100 kHz.

11. A driver for an optical modulator comprising:
a differential input for receiving a differential input electrical signal;
a buffer for separating the driver from a previous circuit;
at least one variable gain amplifier for amplifying the differential input electrical signal into an amplified differential electrical signal;
a first final driver stage amplifier for outputting the amplified electrical signal to the optical modulator;
a first AC coupling enabling independent biasing of one of the at least one variable gain amplifier or the final driver stage amplifier;
a first offset feedback loop extending from reference points at an output of a selected one of the at least one variable gain amplifier or the first final driver stage amplifier to an input of the selected one or a previous one of the at least one variable gain amplifier or the first final driver stage amplifier, including current sources capable of delivering a variable current at an input of the selected one or a previous one of the at least one variable gain amplifier or the first final driver stage amplifier in order to compensate any offset in the amplified differential input electrical signal measured at the reference points; and
a first bias feedback loop including a current sinker for subtracting excess current introduced in the first offset feedback loop.

12. The driver according to claim 11, wherein the first offset feedback loop includes a first comparator capable of comparing portions of the amplified differential electrical signal after the selected one of the at least one variable gain amplifier or the first final driver stage amplifier;
wherein the selected one of the at least one variable gain amplifier or the first final driver stage amplifier includes a differential pair of transistors connected to the input of the selected one or the previous one of the at least one variable gain amplifier or the first final driver stage amplifier; and
wherein the current sources deliver current to the differential pair of transistors.

13. The driver according to claim 12, wherein the first bias feedback loop includes a second comparator capable of comparing a voltage or a current from the selected one of the at least one variable gain amplifier or the first final driver stage amplifier to a reference voltage or current generating a first comparison signal; and
wherein the current sinker comprises a pair of current sinkers controlled based on the first comparison signal.

14. The driver according to claim 11, wherein the first bias feedback loop includes a second comparator capable of comparing a voltage or a current from the selected one of the at least one variable gain amplifier or the first final driver stage amplifier to a reference voltage or current generating a first comparison signal; and
wherein the current sinker comprises:
a single current sinker controlled based on the first comparison signal; and
a pair of transistors coupled between the current sinker and the input of the selected one or a previous one of the at least one variable gain amplifier or the first final driver stage amplifier.

15. The driver according to claim 14, further comprising a DC voltage source for biasing the pair of transistors and enabling current from the current sinker to be divided between the pair of transistors to sink any excess current from the bias feedback loop, whereby an input impedance of the driver is increased by a factor equal to an intrinsic gain of the pair of transistors.

16. The driver according to claim 11, further comprising:
a second AC coupling enabling independent biasing of the buffer;
a second offset feedback loop extending from second reference points after a selected one of the at least one variable gain amplifier or the first final driver stage amplifier to an input of the buffer, the second offset feedback loop including current sources capable of delivering a variable current at the input of the buffer in order to compensate any offset in the amplified differential input electrical signal measured at the second reference points; and
a second bias feedback loop including a current sinker for subtracting excess current introduced in the second offset feedback loop.

17. The driver according to claim 16, wherein the second AC coupling comprises: first and second termination resistors; and first and second DC-blocking capacitors in parallel with the first and second termination resistors.

18. The driver according to claim 17, wherein the second AC coupling includes a common-mode decoupling capacitor disposed between the first and second termination resistors to improve common-mode input return loss.

19. The driver according to claim 18, wherein the previous circuit comprises a digital to analog converter (DAC); and wherein the first AC coupling includes a DAC bias pin to provide biasing from a voltage or current source to optimize at least one of power and performance for the DAC.

20. The driver according to claim 11, wherein the first AC coupling independently biases the final driver stage amplifier; and further comprising:
- first and second splitters for splitting the amplified differential input electrical signal into two parallel amplified signals;
- a second final stage amplifier parallel to the first final driver stage amplifier;
- a second AC coupling parallel to the first AC coupling enabling independent biasing of the second final driver stage amplifier from the first final driver stage amplifier;
- a second offset feedback loop extending from additional reference points after the second final driver stage amplifier to an input of the second final driver stage amplifier, the second offset feedback loop including current sources capable of delivering a variable current at a differential input of the second final stage driver stage amplifier in order to compensate any offset in the amplified differential input electrical signal measured at the additional reference points; and
- a second bias feedback loop including a current sinker for subtracting excess current introduced in the second offset feedback loop.

* * * * *